United States Patent
Denier et al.

(10) Patent No.: US 12,027,559 B2
(45) Date of Patent: Jul. 2, 2024

(54) OPTOELECTRONIC DEVICE, PHOTONIC DETECTOR AND METHOD OF PRODUCING AN OPTOELECTRONIC DEVICE

(71) Applicant: ams International AG, Jona (CH)

(72) Inventors: Urs Denier, Jona (CH); Andreas Fitzi, Jona (CH)

(73) Assignee: AMS INTERNATIONAL AG, Jona (CH)

( * ) Notice: Subject to any disclaimer, the term of this patent is extended or adjusted under 35 U.S.C. 154(b) by 406 days.

(21) Appl. No.: 17/602,083

(22) PCT Filed: Apr. 3, 2020

(86) PCT No.: PCT/EP2020/059557
§ 371 (c)(1),
(2) Date: Oct. 7, 2021

(87) PCT Pub. No.: WO2020/207917
PCT Pub. Date: Oct. 15, 2020

(65) Prior Publication Data
US 2022/0208824 A1  Jun. 30, 2022

(30) Foreign Application Priority Data
Apr. 10, 2019 (EP) .................................. 19168472

(51) Int. Cl.
*H01L 23/00* (2006.01)
*H01L 27/146* (2006.01)
(52) U.S. Cl.
CPC .. *H01L 27/14636* (2013.01); *H01L 27/14683* (2013.01)

(58) Field of Classification Search
CPC .................. H01L 27/14636; H01L 27/14683
See application file for complete search history.

(56) References Cited

U.S. PATENT DOCUMENTS

| 2010/0176466 A1 | 7/2010 | Fujii et al. |
| 2010/0193893 A1 | 8/2010 | Meinhardt et al. |
| 2013/0168750 A1 | 7/2013 | Ikhlef et al. |
| 2015/0295007 A1 | 10/2015 | Cellek et al. |

(Continued)

FOREIGN PATENT DOCUMENTS

| CN | 104979365 A | 10/2015 |
| CN | 207731929 U | 8/2018 |

(Continued)

OTHER PUBLICATIONS

Vilella et al., "3D Integration of Geiger-mode avalanche photodiodes aimed to very high fill-factor pixels for future linear colliders", Nuclear Instruments and Methods in Physics Research A, (2013), vol. 731, pp. 103-108.

(Continued)

*Primary Examiner* — Anthony Ho
(74) *Attorney, Agent, or Firm* — MH2 TECHNOLOGY LAW GROUP LLP

(57) ABSTRACT

An optoelectronic device comprises a first semiconductor layer of a first conductivity having a front side and a backside. A second semiconductor layer of a second conductivity is arranged on the front side of the first semiconductor layer, and further comprises a first semiconductor region and a second semiconductor region forming a photodiode in the second semiconductor layer. A signal path electrically connects the photodiode to a fixed potential.

16 Claims, 3 Drawing Sheets

(56) References Cited

U.S. PATENT DOCUMENTS

2018/0090532 A1    3/2018   Borthakur et al.
2019/0057989 A1    2/2019   Ishiwata et al.

FOREIGN PATENT DOCUMENTS

JP    2012088319 A    5/2012
WO    2012036794 A2   3/2012

OTHER PUBLICATIONS

International Search Report and Written Opinion in corresponding International Application No. PCT/EP2020/059557 mailed on May 13, 2020, 11 pages.
Examination Report issued in corresponding Korean Patent Application No. 10-2021-7036515 dated May 6, 2023, 11 pages, with English translation.
Chinese Examination Report issued in corresponding Chinese Patent Application No. 202080027304.0 dated Jul. 26, 2023, 11 pages, with English translation.

OPTOELECTRONIC DEVICE, PHOTONIC DETECTOR AND METHOD OF PRODUCING AN OPTOELECTRONIC DEVICE

CROSS-REFERENCE TO RELATED APPLICATIONS

The present application is the national stage entry of International Patent Application No. PCT/EP2020/059557, filed on Apr. 3, 2020, and published as WO 2020/207917 A1 on Oct. 15, 2020, which claims the benefit of priority of European Patent Application No. 19168472.9, filed on Apr. 10, 2019, all of which are incorporated by reference herein in their entirety.

FIELD OF THE DISCLOSURE

The disclosure relates to an optoelectronic device, a photonic detector and to a method of producing an optoelectronic device.

BACKGROUND OF THE DISCLOSURE

Through Silicon Vias, TSVs for short, are high performance interconnect techniques used to create 3D-packages and 3D-integrated circuits. Compared to alternative technology, such as package-on-package, interconnect and device density can be substantially higher, and the length of electrical connection may become shorter. TSV technology allows to manufacture devices with small form factors, often exploited by optical products where photodiodes and CMOS circuitry are placed on the front-side of a wafer while having the electrical connection to the printed circuit board, PCB, on the backside of the wafer with bumps and a redistribution layer, RDL, for example. The CMOS circuitry including the photodiode can be electrically connected to the backside by means of the TSVs.

In order to achieve high performance, the photodiode should be connected with a low impedance in order to avoid an electrical performance degradation by cross coupling interferences from the CMOS circuitry into the sensitive nodes of the photodiode or photodiode amplifier, respectively. This typically also applies for the interaction between TSV and photodiode, which is connected by parasitic effects such as a finite substrate resistance and capacitive coupling to the substrate. Consequently, digital signals couple into the surrounding substrate of the TSV and may impact the electrical characteristics of the photodiode which shares the same substrate.

FIG. 3 shows an embodiment of a prior art optoelectronic device. Today, high performance photodiodes are often built by using a substrate of semiconductor start material and adding an epilayer on top of the substrate with higher resistivity. This allows an extension of the photodiode space charge region and subsequently a lower parasitic capacitance resulting in lower overall noise of the photodiode frontend. The anode of the photodiode is connected by adding a p+-type diffusion to the epilayer, which, together with the substrate underneath, forms a backside anode connection. FIG. 2 shows this standard configuration of optoelectronic device today. However, these device have the drawback that the photodiode's anode terminal is connected with a relatively high series resistance due to the higher resistivity of the epilayer. The configuration is sensitive to interferences due to the relatively high resistance of the anode connection which usually has the same potential as the substrate. Furthermore, the power dissipation of the circuitry causes a heating of the device with a limited thermal sink through the backside RDL and its isolation layer to the substrate.

SUMMARY OF THE DISCLOSURE

It is to be understood that any feature described in relation to any one embodiment may be used alone, or in combination with other features described herein, and may also be used in combination with one or more features of any other of the embodiments, or any combination of any other of the embodiments unless described as an alternative. Furthermore, equivalents and modifications not described below may also be employed without departing from the scope of the optoelectronic device, photonic detector method of producing an optoelectronic device which are defined in the accompanying claims.

The following relates to an improved concept in the field of semiconductor optoelectronic devices, e.g. photodiodes, such as PIN photodiodes. The improved concept provides a low ohmic connection, avoiding crosstalk and improves thermal properties of the optoelectronic device. This can be achieved by means of a signal path which electrically connects the photodiode arranged in the optoelectronic device to a fixed potential. Such signal path may effectively implement a short circuit path.

For example, instead of connecting an anode of the photodiode through a through-silicon-via, TSV, in combination with an electrical wire to a corresponding p+-type diffusion, a backside contact can be employed. Such a backside contact can be formed by removing the backside RDL oxide of a redistribution layer, RDL, at certain areas and by directly connecting a RDL metallization to the substrate. By using highly doped substrate as start material, no separate doping for a contact is needed while building of a Schottky Diode is also avoided due to the usage of highly doped substrate. In at least one embodiment an optoelectronic device comprises a first semiconductor layer, a second semiconductor layer and a signal path. The first semiconductor layer is of a first conductivity and has a front side and a backside. The second semiconductor layer is of a second conductivity and arranged on the front side of the first semiconductor layer. Furthermore, the second semiconductor layer comprises a first semiconductor region and a second semiconductor region. The first and second semiconductor regions form a photodiode in the second semiconductor layer. Finally, the signal path electrically connects the photodiode to a fixed potential.

The semiconductor layers comprise pure or doped semiconductor material such as silicon or compound semiconductors. For example, the first and second semiconductor layers have different levels of doping. The level of doping may increase along the signal path such that the level of doping of the first semiconductor layer is higher than that of the second semiconductor layer. Increased doping leads to increased conductivity due to a higher concentration of charge carriers.

For example, optoelectronic device comprises a single semiconductor die, wherein the semiconductor die comprises the semiconductor layers, i.e., the first semiconductor layer, second semiconductor layer and signal path. The optoelectronic device constitutes an integrated circuit. The single semiconductor die, in the context of said integrated circuit, can be considered a small block of semiconducting material on which the optoelectronic device is fabricated. For example, the optoelectronic device is produced in large batches on a single wafer. The wafer may be cut (diced) into many semiconductor dies, each containing one copy of the optoelectronic device.

The signal path becomes a preferred, low ohmic route that electrically connects the photodiode to a fixed potential. At the same time alternative signal paths are rendered inferior. This effect may be further increased by using different levels of doping along the signal path. As a consequence crosstalk can be reduced, e.g. when compared to a structure which uses TSVs to connect to terminals of the photodiode. Coupling from TSVs into sensitive photodiode frontends are effectively reduced or even avoided. This increases the overall performance (signal to noise) of the optoelectronic device. Furthermore, contacting the photodiode in the way proposed above also improves thermal sink of the optoelectronic device as thermal resistance of the signal path can be kept low. For example, the optoelectronic device can be operated with higher power dissipation to further improve performance while limiting temperature increase of the chip due to the heat sink of optoelectronic device backside connection.

In at least one embodiment the signal path electrically connects the photodiode with the backside of the semiconductor layer. Connecting the photodiode through the semiconductor layers from the backside enables a very low ohmic connection of the photodiode terminal while avoiding the high impedance path through other electrical connections such as TSVs or an epilayer. The connection can be considered similar to a chip-on-board mounting method and using a conductive glue to employ a low ohmic connection between the electrical components such as the photodiode and the semiconductor layers as substrate.

In at least one embodiment a first contact area is arranged on the backside of the first semiconductor layer and coupled to the signal path. The first contact area allows for electrically contacting the photodiode from the backside using the signal path. The contact area may be directly connected to the first semiconductor. Electrical connectors such as bumps, or solder balls, may be used to establish connection to further printed circuit boards.

In at least one embodiment a redistribution layer is arranged on the backside of the first semiconductor layer. The redistribution layer further comprises an oxide layer and a metallization layer. The redistribution layer comprises the first contact area such that the signal path electrically connects the photodiode with the first contact area.

For example, the oxide layer is at least partially removed to free a first contact area on the backside. Alternatively, or in addition, the oxide layer is structured such that the first contact area can be connected from the backside. The metallization layer of the first contact area allows for directly contacting the backside of the first semiconductor layer. This way the signal path can be used to electrically connect the photodiode via the first contact area, e.g. by means of bumps coupled to the contact area. No connection to TSVs is needed to contact the photodiode.

In at least one embodiment the signal path comprises a dummy through-substrate-via. The signal path which electrically connects the photodiode to a fixed potential may be implemented with one of more through-substrate-via instead, or in addition. A dummy TSV electrically connects the photodiode to the backside, such as the first contact area, for example. The dummy TSV may also be connected to circuitry of the optoelectronic device which provide said fixed potential. The dummy TSVs are not connected to other functional circuits of the optoelectronic device or may only be conducting inside the first semiconductor layer. The dummy through-substrate-vias provide an alternative way, or complement, to establishing the signal path through the semiconductor layers.

In at least one embodiment the second semiconductor layer comprises one or more functional circuits. Furthermore, one or more through-silicon-vias are arranged in the first and second semiconductor layer. One or more bumps are arranged on the backside to electrically connect the one or more functional circuits via the one or more through-silicon-vias, respectively.

The TSVs electrically connect, and thereby make available, the functional circuits, to and from the backside of the optoelectronic device. Bumps establish connection to other printed circuit boards, for example. The functional circuits may be CMOS circuitry. The functional circuits add functionality to the optoelectronic device and may complement the device to function as ambient light sensor, proximity sensor, RGB and XYZ color sensor, gesture sensor, Light-to-Frequency (LTF) sensor, Light-to-Voltage (LTV) sensor and/or Linear Array. As such the functional circuits may include drivers, control logic, analog-to-digital converters, time-to-digital converters, microprocessors, signal processor, or ASICs. Thus, the functional circuits allow for a highly integrated sensor solution. The optoelectronic device may comprise several functional tiers which are interconnected via the bumps, or solder balls.

In at least one embodiment a backend layer is arranged on the second semiconductor layer. Furthermore, a coating layer is arranged contiguous with the backend layer. In this way the photodiode is at least partly enclosed by the coating layer. For example, the coating layer at least partly encloses the photodiode. The coating layer may have anti-reflective properties, e.g. is arranged to reflect light being incident on the optoelectronic device and allows only light from a desired wavelength or range of wavelengths to pass through. Undesired wavelengths are reflected.

Such anti-reflective coating, ARC, may be implemented in different ways including topARC, BARC, Bottom Anti-Reflective Coating and eBARC, Embedded BARC.

In at least one embodiment the second semiconductor layer is an epilayer. The epilayer is structured so as to provide at least a second contact area on the front side. In addition, or alternatively, an oxide layer is arranged on the epilayer comprising a metallization at least coupled to the second contact area. The epilayer allows for optimizing properties of the photodiode, including increasing quantum efficiency and low light sensitivity. The epilayer may have higher resistivity than the first semiconductor layer but allows extending of the photodiode space charge region and subsequently a lower parasitic capacitance resulting in lower overall noise of a photodiode frontend.

In at least one embodiment the first semiconductor region is of n+-type conductivity and the second semiconductor region is of p+-type conductivity, or vice versa. The first semiconductor region and the second semiconductor region are spaced apart to form a PIN photodiode in the second semiconductor layer. The PIN photodiode features improved sensitivity and performance over that of a pn-junction photodiode. For example, PIN photodiode can be provided with larger active area in which the light photons can be collected and converted. A large depletion region can be created due to adding an intrinsic area into the pn-junction to create the PIN junction, for example.

In at least one embodiment the first semiconductor layer is highly doped having p++-type or n++-type conductivity. High doping increases the number of available charge carriers in the layer. This way the signal path can be favored over other possible routes through the semiconductor layers.

In at least one embodiment a photonic detector comprises an optoelectronic device according to the concept discussed above. Furthermore, a driver circuit is arranged to operate the optoelectronic device. In addition, or alternatively, a signal processor is arranged to process sensor signals to be generated by the optoelectronic device. The driver circuit and the signal processor may be arranged on a common semiconductor die or as separate printed circuits boards. Together with the optoelectronic device a highly integrated photonic detector can be realized which shares the advantageous features of the optoelectronic device. The photonic detector may be arranged as ambient light sensor, proximity sensor, RGB and XYZ color sensor, gesture sensor, Light-to-Frequency (LTF) sensor, Light-to-Voltage (LTV) sensor and/or Linear Array.

A method of producing an optoelectronic device can be executed as a multiple-step sequence of photolithographic and/or chemical processing steps during which components of an optoelectronic device are gradually created on a wafer made of semiconductor layers, such as pure or doped semiconducting material. For example, silicon or compound semiconductors are used as material for the semiconductor layers.

In at least one embodiment a method of producing an optoelectronic device comprises the steps of providing a first semiconductor layer of a first conductivity having a front side and a backside. A second semiconductor layer is arranged of a second conductivity and on the front side of the semiconductor layer. The second semiconductor layer is provided with a first semiconductor region and a second semiconductor region which form a photodiode in the second semiconductor layer. Finally, a signal path electrically connects the photodiode to a fixed potential.

For example, the level of doping increases along the signal path such that the level of doping of the first semiconductor layer is higher than that of the second semiconductor layer. Increased doping leads to increased conductivity due to a higher concentration of charge carriers. This way the signal path becomes a preferred, low ohmic route that electrically connects the photodiode to a fixed potential on the backside of the first semiconductor layer. At the same time alternative signal paths are rendered inferior. As a consequence crosstalk can be reduced, e.g. when compared to a structure which uses TSVs to connect to terminals of the photodiode. Furthermore, contacting the photodiode in the way proposed above also improves thermal sink of the optoelectronic device as thermal resistance of the signal path can be kept low.

In at least one embodiment a plurality of optoelectronic devices is produced on a single wafer. Individual optoelectronic device are fabricated by cutting or deicing the single wafer into a plurality of semiconductor dies, each having one copy of the optoelectronic device.

In at least one embodiment a redistribution layer is arranged on the backside of the first semiconductor layer. The redistribution layer further comprises an oxide layer and a metallization layer. The oxide layer is at least partially removed to free a first contact area on the backside. For example, the metallization layer of the first contact area allows for directly contacting the backside of the first semiconductor layer. This way the signal path can be used to electrically connect the photodiode via the first contact area, e.g. by means of bumps coupled to the contact area. No connection to TSVs is needed to contact the photodiode.

In at least one embodiment the oxide layer is structured on the backside such as to keep the first contact area free. Furthermore, the redistribution layer is arranged on and coupled to the first contact area.

In at least one embodiment the first semiconductor region is provided of n+-type conductivity and the second semiconductor region is provided of p+-type conductivity, or vice versa. The first semiconductor region and the second semiconductor region are spaced apart so as to form a PIN photodiode in the second semiconductor layer. In addition, or alternatively, the first semiconductor layer is highly doped having p++-type conductivity or n++-type conductivity.

Further implementations of the method of producing an optoelectronic device are readily derived from the various implementations and embodiments of the optoelectronic device and photonic detector and vice versa.

In the following, the concept presented above is described in further detail with respect to drawings, in which examples of embodiments are presented. In the embodiments and Figures presented hereinafter, similar or identical elements may each be provided with the same reference numerals. The elements illustrated in the drawings and their size relationships among one another, however, should not be regarded as true to scale, rather individual elements, such as layers, components, and regions, may be exaggerated to enable better illustration or a better understanding.

DETAILED DESCRIPTION

Figure 1:
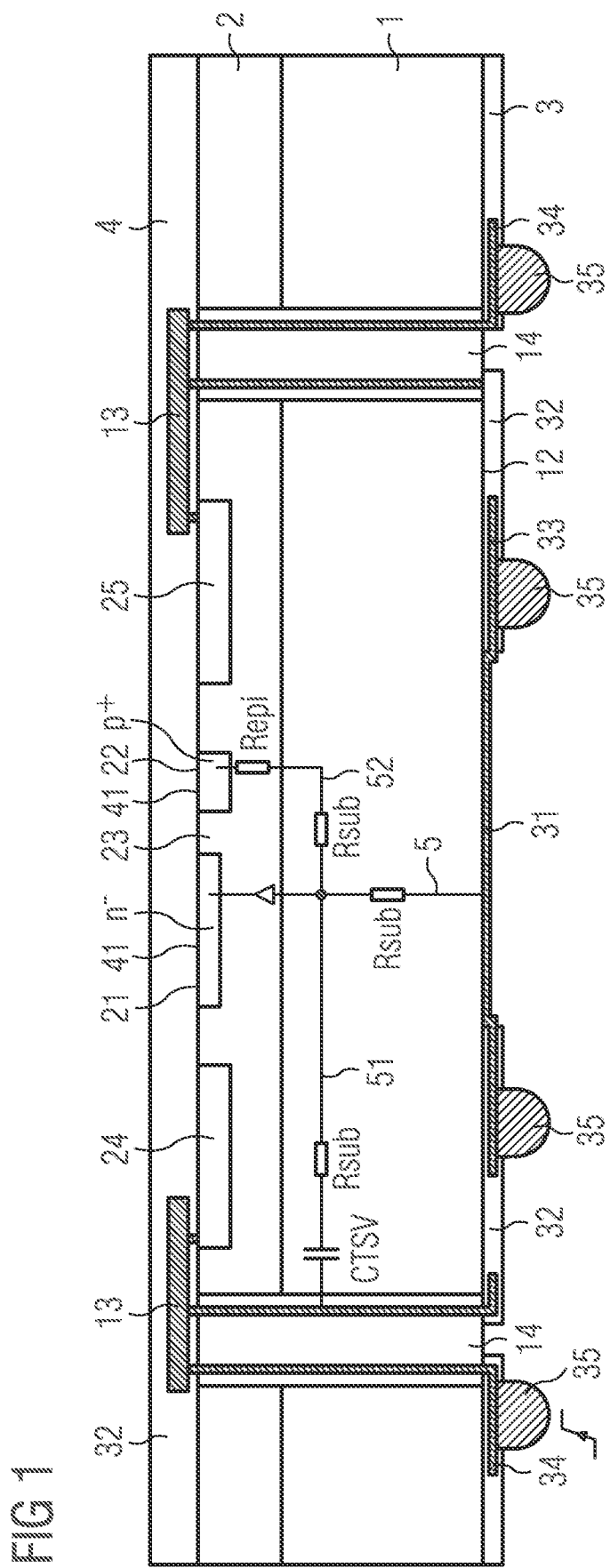
FIG. 1 shows an example embodiment of an optoelectronic device.

FIG. 1 shows an example embodiment of an optoelectronic device. The optoelectronic device comprises semiconductor die with at least a first and a second semiconductor layer 1, 2 and a signal path 5 which is arranged in the two layers.

The first semiconductor layer 1 is of a first conductivity, such as n-type or p-type. In this example embodiment the first semiconductor layer is highly doped having p++-type conductivity. In other embodiments (not shown) the conductivity may be reversed and the first semiconductor layer has n++-type conductivity. Furthermore, the first semiconductor layer 1 has a front side 11 and a backside 12. For example, the front side can be exposed with light being incident on the optoelectronic device. The backside 12 is used for electrically contacting the optoelectronic device as will be discussed in further detail below.

The second semiconductor layer 2 is of a second conductivity, such as n-type or p-type. However, the particular type of conductivity is different from that of the first semiconductor layer 1. In this particular embodiment the second semiconductor layer is an n-type epilayer which is arranged on the front side 11 of the first semiconductor layer 1. In other embodiments (not shown) the conductivity may be reversed and the second semiconductor layer comprises a p-type epilayer.

The second semiconductor layer 2 further comprises a first semiconductor region 21 and a second semiconductor region 22 which are arranged in the epilayer, e.g. contiguous with a surface of the epilayer facing light being incident on the optoelectronic device. The first semiconductor region 21 is of n+-type conductivity and the second semiconductor region 22 is of is p+-type conductivity. In other embodiments (not shown) the conductivity may be reversed. The two semiconductor regions 21, 22 are spaced apart in the epilayer and form a PIN photodiode. For example, an undoped intrinsic semiconductor region is established between the first semiconductor region 21 and the second semiconductor region 22.

The second semiconductor layer 2 comprises functional circuits 24, 25, such as CMOS circuitry. The functional circuits may include components such as amplifiers, control logic, microprocessors, analog-to-digital converters, time-to-digital converters, ASICs, and the like. For example, the functional circuits comprise in a single chip the components to operate the optoelectronic device as an optical sensor, such as an ambient light sensor or color sensor, for example. The functional circuits may also provide electrical components necessary to integrate the optoelectronic device in a sensor package used for proximity, gesture, ambient light, color and/or spectral sensing applications.

Through-silicon-vias, TSVs, 14 are arranged in the first and second semiconductor layer. Two TSVs are depicted in the drawing. The TSVs electrically connect to the functional circuits 24, 25, respectively. The TSVs constitute vertical electrical connections, vias, and pass completely through the first and second semiconductor layer. The TSVs allow for contacting the functional circuits 24, 25 from the backside 12 of the first semiconductor layer. In fact, the epilayer is structured so as to provide contact areas 13 on the front side 11 and electrically connects the TSVs to the functional circuits 24, 25, respectively. However, in addition or alternatively, an electrical connection is established by means of a metallization arranged in an oxide layer 32 which electrically connects the TSVs via the contact areas 13 to the functional circuits 24, 25, respectively.

In this embodiment a backend layer 4 is arranged on the second semiconductor layer 2, facing light being incident on the optoelectronic device. For example, the backend layer 4 comprises the oxide layer 32. Furthermore, a coating layer 41 is arranged in the backend layer 4, e.g. contiguous with the backend layer 4. As a result the photodiode 23 is at least partly enclosed by the coating layer 41. The coating layer 41 has anti-reflective properties. For example, the coating layer 41 is arranged to reflect light being incident on the optoelectronic device and allows only light from a desired wavelength or range of wavelengths to pass through. Undesired wavelengths are reflected.

Such anti-reflective coating, ARC, may be implemented in different ways. For example, the oxide layer 32 above (i.e., a direction facing light being incident on the optoelectronic device) the photodiode 23 is removed and substituted with the coating layer 41 instead. Instead the oxide layer 32 may on its surface be coated with the coating layer 41, topARC. Furthermore, a groove may be etched into the oxide layer 32 above and all the way down to the photodiode 23. The coating layer 41 is arranged into the groove and onto the photodiode, BARC, Bottom Anti-Reflective Coating. However, the coating layer 41 may be arranged on the photodiode 23 before the oxide layer 32 is applied. This way the coating layer 41 is embedded in the oxide layer 32, eBARC (Embedded BARC).

A redistribution layer 3 is arranged on the backside 12 of the first semiconductor layer 1. The redistribution layer 3 comprises an oxide layer 32 and a metallization layer 33. A first contact area 31 of the metallization layer 33 is arranged on an area of the backside 12 which is free of oxide layer 32. In other words, the first contact area 31 is electrically connected to the backside 12 of the first semiconductor layer 1 and thereby establishes a backside contact of the optoelectronic device. However, the first contact area 31 is not electrically connected to the TSVs. Rather the TSVs are connected to third contact areas 34 of the metallization layer. Furthermore, the first contact area 31 and the third contact areas 34 are connected to bumps 35, respectively, to allow for making the contact areas available for electrical contact to external components, such as integrated circuits or power supplies, etc.

The redistribution layer 3 can be manufactured in different ways. For example, the oxide layer 32 can be structured on the backside 12 such as to keep an area free. In an additional step, the first contact area 31 can then be arranged in the area free of the oxide layer. Alternatively, the oxide layer 32 can first be applied to the backside 12 and then, in an additional step, removed to free an area in which the first contact area 31 can be established.

A signal path 5 is formed during operation of the optoelectronic device which electrically connects the photodiode 23 to a fixed potential. In fact, the signal path electrically connects the photodiode 23 with the backside 12 of the first semiconductor layer 1. The signal path 5 is depicted the drawing based on an equivalent circuit diagram.

In more detail, the first signal path 5 is established between the first and second semiconductor regions 21, 22, respectively, through the first and second semiconductor layers 1, 2 and the metallization layer 33. The signal path 5 can be contacted via the first contact area 31 and the bump or bumps 35 attached thereto.

In the equivalent circuit diagram there are two example signal paths 51, 52 connecting the first and second semiconductor regions 21, 22 with one of the TSVs 14, respectively. The example signal paths are represented by a resistor Repi, being representative of a resistivity of the epilayer, and resistors Rsub, being representative of a resistivity of the first semiconductor layer. Capacitor Ctsv represents a capacitor characteristic for TSV 14. Together the example pathways constitute a relatively high series resistance due to the higher resistivity of the epilayer. This configuration alone would be sensitive to interferences as discussed in the introductory part. However, connecting from the backside 12 as suggested by the improved concept enables a very low ohmic connection of the photodiode 23 while avoiding the high impedance example signal paths 51, 52 through the TSV 14 and epilayer. The connection is therefore equivalent to a chip on board mounting method and using a conductive glue to employ a low ohmic connection between the PCB and the substrate. The usage of highly doped substrate material further avoids a separate doping process step to implement a metal to substrate connection on the substrate, i.e. the metallization layer can directly be attached to the substrate, i.e. the first semiconductor layer. Furthermore, the removal of the oxide layer of the redistribution layer decreases the thermal resistance between the substrate and PCB, enabling a better heat sink for the chip.

The improved concept virtually avoids any coupling from TSVs into sensitive photodiode frontends. This increases the overall performance (signal to noise) of such circuitries. Furthermore, it allows to operate the circuit with higher power dissipation to further improve the performance while limiting the temperature increase of the chip due to the heat sink of the backside terminal.

Figure 2:
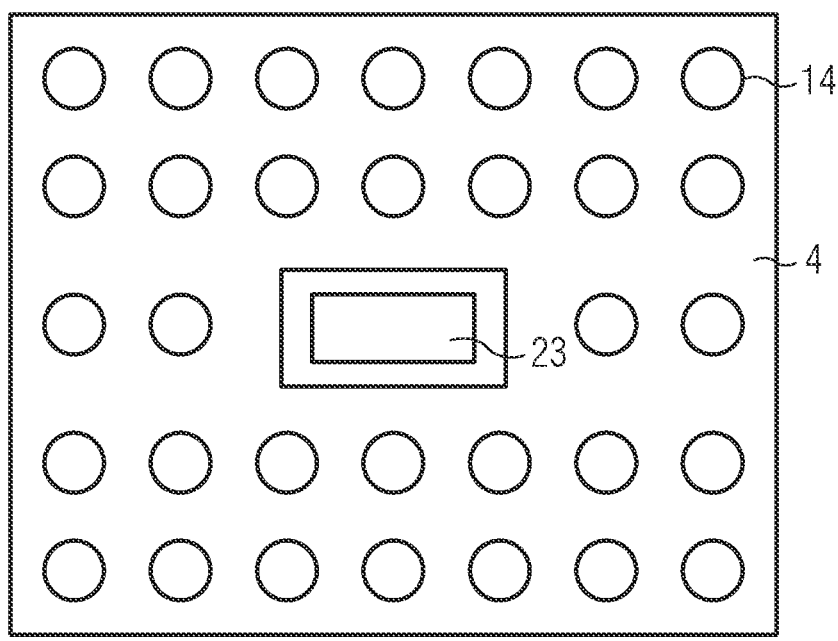
FIG. 2 shows an example embodiment of a photonic detector.
Figure 2:
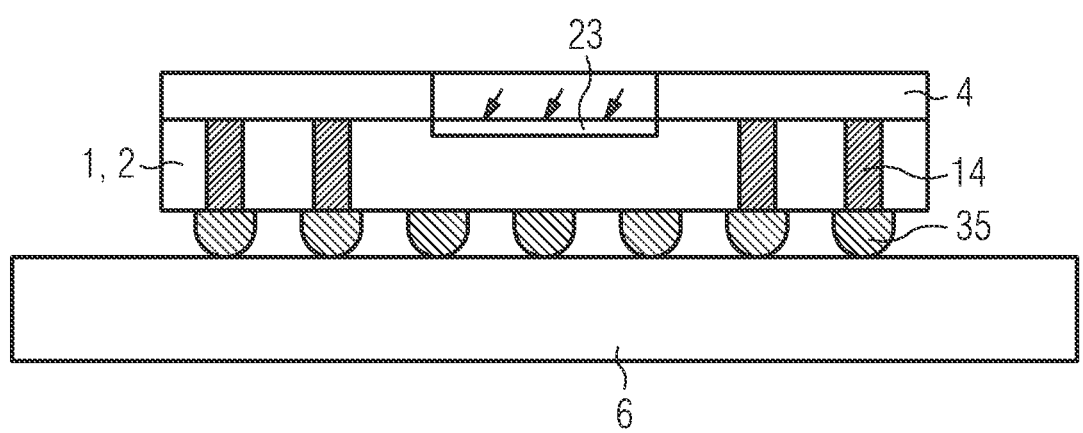
Figure 3:
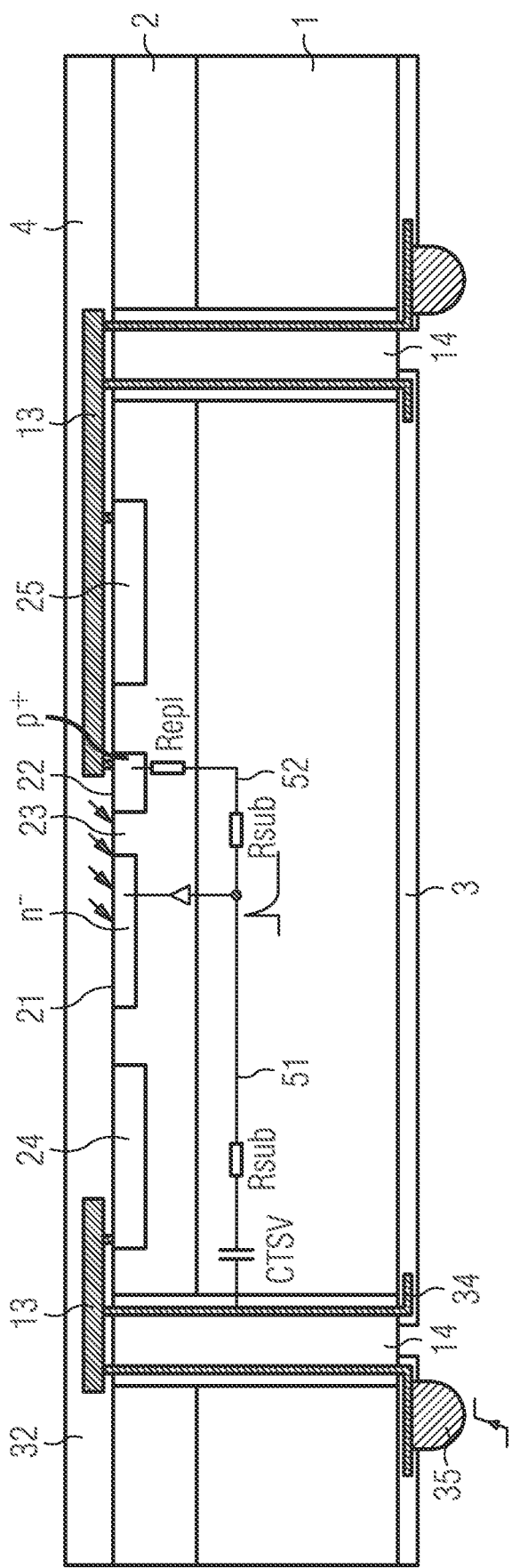
FIG. 3 shows an embodiment of a prior art optoelectronic device.

FIG. 2 shows an example embodiment of a photonic detector. The upper part of the drawing shows a top view and the lower part of the drawing shows a side view of the photonic detector. The optoelectronic device discussed in FIG. 1 is mounted on and electrically connected to a printed circuit board 6.

The photonic detector comprises a driver circuit which is arranged to operate the optoelectronic device. In addition, the photonic detector comprises a signal processor which is arranged to process sensor signals to be generated by the optoelectronic device. The driver circuit and the signal processor may be integrated in the optoelectronic device, e.g. as functional circuit 24, 25 discussed above. However, one or both components can be arranged on the printed circuit board 6 instead. Together with the optoelectronic device a highly integrated photonic detector can be realized and may be arranged as ambient light sensor, proximity sensor, RGB and XYZ color sensor, gesture sensor, Light-to-Frequency (LTF) sensor, Light-to-Voltage (LTV) sensor and/or Linear Array.

The invention claimed is:

1. An optoelectronic device, comprising:
    a first semiconductor layer of a first conductivity having a front side and a backside,
    a second semiconductor layer of a second conductivity arranged on the front side of the first semiconductor layer, further comprising a first semiconductor region and a second semiconductor region forming a photodiode in the second semiconductor layer, and
    a signal path electrically connecting the photodiode to a fixed potential, wherein
    the second semiconductor layer is an epilayer,
    the epilayer is structured so as to provide at least a second contact area on the front side, and/or
    a backend layer is arranged on the epilayer and comprises a metallization which, at least, is coupled to the second contact area.

2. The optoelectronic device according to claim 1, comprising a single semiconductor die further comprising the first and the second semiconductor layer and the signal path.

3. The optoelectronic device according to claim 1, wherein the signal path electrically connects the photodiode with the backside of the first semiconductor layer.

4. The optoelectronic device according to claim 1, wherein a first contact area is arranged on the backside of the first semiconductor layer and coupled to the signal path.

5. The optoelectronic device according to claim 4, wherein
    a redistribution layer is arranged on the backside,
    the redistribution layer further comprises an oxide layer and a metallization layer, and
    the redistribution layer comprises the first contact area such that the signal path electrically connects the photodiode with the first contact area.

6. The optoelectronic device according to claim 1, wherein the signal path comprises a dummy through-substrate-via.

7. The optoelectronic device according to claim 1, wherein:
    the second semiconductor layer comprises one or more functional circuits,
    one or more through-silicon-vias are arranged in the first and second semiconductor layer, and
    one or more bumps are arranged on the backside to electrically connect the one or more functional circuits via the one or more through-silicon-vias.

8. The optoelectronic device according to claim 1, wherein
    a backend layer is arranged on the second semiconductor layer, and
    a coating layer is arranged contiguous with the backend layer, such that photodiode is at least partly enclosed by the coating layer.

9. The optoelectronic device according to claim 1, wherein:
    the first semiconductor region is of n+-type conductivity and the second semiconductor region is of is p+-type conductivity, or vice versa, and
    the first semiconductor region and the second semiconductor region are spaced apart to form a PIN photodiode in the second semiconductor layer.

10. The optoelectronic device according to claim 1, wherein the first semiconductor layer is highly doped having p++-type or n++-type conductivity.

11. A photonic detector, comprising:
    an optoelectronic device comprising,
    a first semiconductor layer of a first conductivity having a front side and a backside,
    a second semiconductor layer of a second conductivity arranged on the front side of the first semiconductor layer, further comprising a first semiconductor region and a second semiconductor region forming a photodiode in the second semiconductor layer, and
    a signal path electrically connecting the photodiode to a fixed potential, further comprising,
    a driver circuit to operate the optoelectronic device, and/or
    a signal processor to process sensor signals to be generated by the optoelectronic device.

12. The photonic detector according to claim 11, wherein the driver circuit and/or the signal processor are integrated in the optoelectronic device.

13. A method of producing an optoelectronic device, comprising:
    providing a first semiconductor layer of a first conductivity having a front side and a backside,
    arranging a second semiconductor layer of a second conductivity on the front side of the first semiconductor layer, wherein the second semiconductor layer is provided with a first semiconductor region and a second semiconductor region forming a photodiode in the second semiconductor layer, and
    electrically connecting via a signal path the photodiode to a fixed potential,
    wherein a plurality of optoelectronic devices is produced on a single wafer and individual optoelectronic devices are fabricated by cutting or deicing the single wafer into a plurality of semiconductor dies, each having one copy of the optoelectronic device.

14. The method according to claim 13, wherein:
    an oxide layer is arranged on the backside of the semiconductor layer,
    the oxide layer is at least partially removed to free a first contact area on the backside, and
    a redistribution layer is arranged on and coupled to the first contact area.

15. The method according to claim 13, wherein:
    the oxide layer is structured on the backside such as to keep free the first contact area, and
    a redistribution layer is arranged on and coupled to the first contact area.

16. The method according to claim 13, wherein:
    the first semiconductor region is provided of n+-type conductivity and the second semiconductor region is provided of p+-type conductivity, or vice versa, the first semiconductor region and the second semiconductor region are spaced apart so as to form a PIN photodiode in the second semiconductor layer, and/or the first semiconductor layer is highly doped having p++-type or n++-type conductivity.

\* \* \* \* \*